United States Patent [19]

Terman

[11] 4,087,812

[45] May 2, 1978

[54] DIGITAL-TO-ANALOG AND ANALOG-TO-DIGITAL CONVERTER CIRCUIT

[75] Inventor: Lewis Madison Terman, South Salem, N.Y.

[73] Assignee: International Business Machines Corporation, Armonk, N.Y.

[21] Appl. No.: 644,000

[22] Filed: Dec. 23, 1975

[51] Int. Cl.² .............................................. H03K 13/02
[52] U.S. Cl. ...................... 340/347 AD; 340/347 DA; 357/24
[58] Field of Search ................... 357/24; 340/347 AD, 340/347 DA

[56] References Cited

U.S. PATENT DOCUMENTS

| | | | |
|---|---|---|---|
| 3,836,906 | 9/1974 | Ando | 340/347 DA |
| 3,903,543 | 9/1975 | Smith | 340/347 AD |
| 3,930,255 | 12/1975 | Means | 340/347 AD |

OTHER PUBLICATIONS

Mok "Solid–State Electronics," 1974, vol. 17, pp. 1147–1154.

Primary Examiner—Charles D. Miller
Attorney, Agent, or Firm—John J. Goodwin

[57] ABSTRACT

Digital-to-analog and analog-to-digital converter circuit embodiments are provided employing charge-transfer-device technology, for example charge-coupled-devices (CCDs). The circuit includes a plurality such as three identical CCD storage electrode plates for forming CCD wells with interposed transfer electrode gates and input and output means such as diffusions, all disposed on or in a semiconductor substrate. Means are provided for varying the potentials applied to the at least three identical electrode plates and corresponding transfer gates and a comparator means is included for comparing the voltage under the first CCD storage electrode plate with an analog voltage level to be converted to digital representation. The three identical CCD storage electrode plates function as charge dividing, accumulating and storage means and charge is transferred or shifted between CCD wells by a sequence of steps to convert an analog signal into a corresponding digital signal or, in another embodiment, a digital signal into a corresponding analog signal.

9 Claims, 5 Drawing Figures

4,087,812

DIGITAL-TO-ANALOG AND ANALOG-TO-DIGITAL CONVERTER CIRCUIT

BACKGROUND OF THE INVENTION

1. Field of the Invention

The present invention relates to digital-to-analog and analog-to-digital converter circuits and more particularly to converter circuits employing charge-transfer technology such as charge-coupled-device structures.

2. Description of the Prior Art

Digital-to-analog converters and analog-to-digital converters are very useful devices in data handling and data processing, and many different types of converters are available in varied technologies. A common type of converter is the resistive ladder type wherein a plurality of resistors of different weighted values corresponding to digital values are selectively combined to form a digital representation of the magnitude of an input analog signal. Another common type of converter circuit employs a plurality of capacitors arranged in weighted order magnitudes in combination with switching means such as transistors. An example of the latter scheme is described in U.S. Pat. No. 3,836,906 issued Sept. 17, 1974 to T. Ando et al. on an application filed Feb. 28, 1973 assigned to Sony Corporation.

Another prior art converter, a serial charge-redistribution digital-to-analog converter including two capacitors, is described in the publication "An All-MOS Charge-Redistribution A/D Conversion Technique" by Ricardo E. Suarey, Paul R. Gray and David A. Hodges published in the 1974 IEEE International Solid-State Circuits Conference Digest of Technical Papers, pg. 194.

The present invention is distinct from prior art converters in that charge-coupled-device circuits are employed wherein the charge transfer capabilities of such circuits permit efficient and accurate operation.

SUMMARY OF THE INVENTION

An object of the present invention is to provide circuit embodiments for digital-to-analog and analog-to-digital conversion employing charge-coupled-devices.

It is another object of the present invention to provide digital-to-analog and analog-to-digital converter circuit embodiments employing complete charge transfer between CCD wells to effect the conversion.

It is a further object of the present invention to provide digital-to-analog and analog-to-digital converter circuit embodiments employing charge division between CCD wells.

The foregoing and other objects, features and advantages of the invention will be apparent from the following more particular description of a preferred embodiment of the invention, as illustrated in the accompanying drawings.

DETAILED DESCRIPTION OF THE INVENTION

Figure 1:
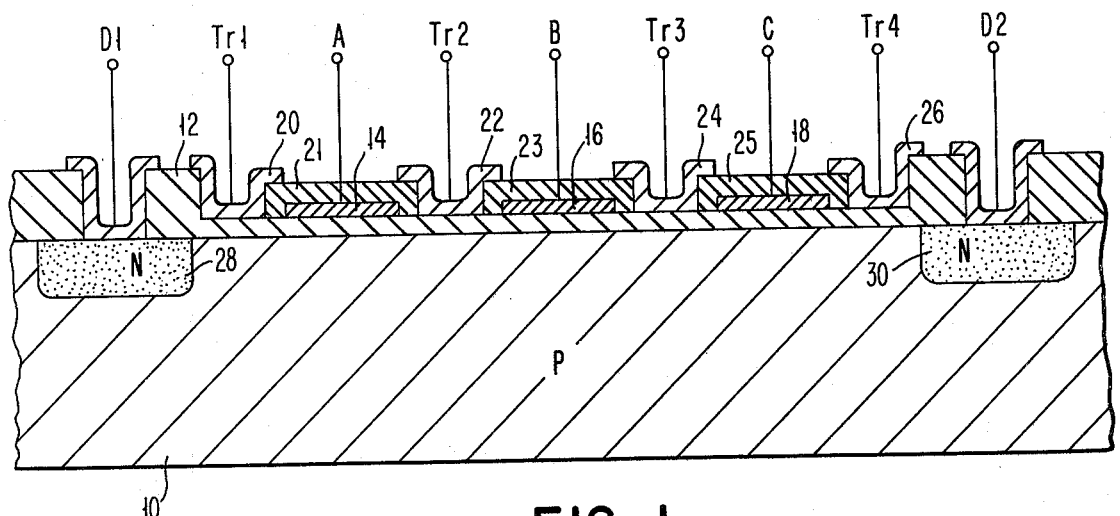
FIG. 1 is a schematic cross-sectional illustration of an embodiment of an analog-to-digital converter circuit employing charge-coupled-device technology according to the principles of the present invention.

The circuit shown in FIG. 1 illustrates an embodiment of an analog-to-digital or digital-to-analog converter including a substrate 10 composed of suitable material such as p-type silicon having an insulating layer 12 of material such as silicon dioxide disposed thereon. A plurality of three storage electrode plates 14, 16, 18 are disposed on layer 12 and are connected to input leads which are designated respectively as A, B and C and function to create potential storage wells in the silicon surface disposed directly beneath the respective electrode storage plates. Storage electrodes 14, 16 and 18 are interposed between four transfer gates 20, 22, 24 and 26 which are connected to leads designated $Tr1$, $Tr2$, $Tr3$ and $Tr4$. Insulating material 21, 23 and 25 are provided to electrically isolate the electrodes from adjacent electrodes. Storage electrodes 14, 16 and 18 and transfer gates 20, 22, 24 and 26 may be formed of conductive material such as aluminum or polysilicon.

A diffusion 28 and a diffusion 30 are disposed in substrate 10 adjacent to transfer gates 20 and 26. Diffusion 28 is connected through a contact to a lead D1 and diffusion 30 is connected through a contact to a lead D2. Diffusions 28 and 30 are of opposite conductivity type to the substrate and may be composed of n-type material in the present embodiment. Diffusion 28 functions to insert or remove charge carriers in or out of the potential storage well under storage electrode 14 and diffusion 30 functions to insert or remove charge carriers in or out of the potential storage well under storage electrode 18. The embodiment thus far described in FIG. 1 operates in a conventional charge-coupled-device manner wherein potential wells are formed under storage electrodes 14, 16 and 18 which are capable of storing charge carriers and transfer gates 20, 22, 24 and 26 are provided for shifting the charge carriers between the potential wells. An explanation of how a typical charge-coupled-device operates is provided in the book entitled "Charge Transfer Devices" by Carlo H. Sequin and Michael F. Tompsett, published by Academic Press, Inc. and copyrighted in 1975 by Bell Telephone Laboratories, Incorporated (Library of Congress Catalog Card Number: 63-12814).

Figure 2:
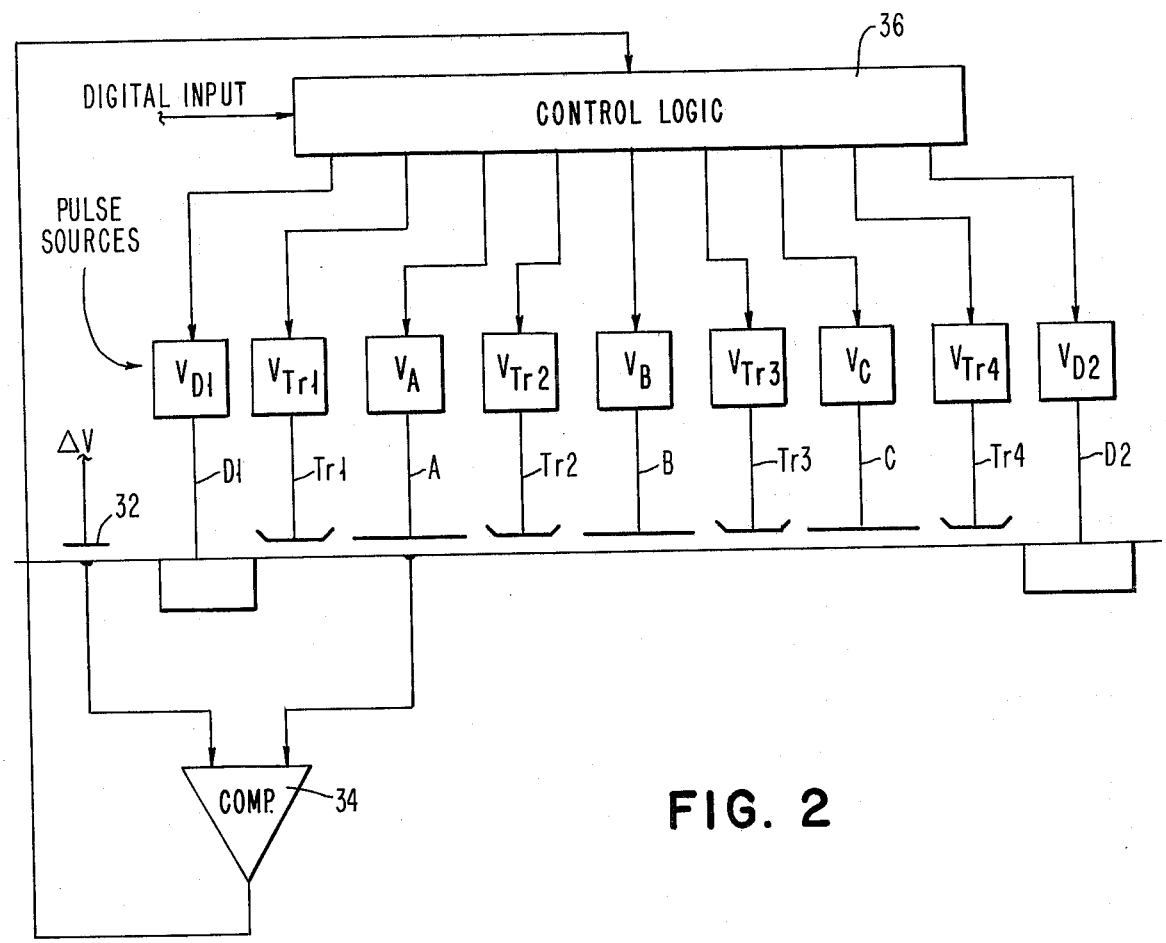
FIG. 2 is a schematic diagram illustrating the control logic associated with the embodiment of FIG. 1.

Referring to FIG. 2 a schematic illustration is shown of the embodiment of FIG. 1 further including the associated circuits for carrying out the operation of the present invention. The previously discussed leads are shown connected to associated pulse sources with lead D1 from diffusion 28 connected to pulse source $V_{D1}$, lead $Tr1$ from transfer gate 20 connected to pulse source $V_{Tr1}$, lead A from storage electrode 14 connected to pulse source $V_A$, and so on. An input electrode 32 identical to electrode 14 shown connected to a voltage $\Delta V$ which is the input analog signal which will be converted to digital form. Input electrode 32 is disposed on substrate 10 and insulating layer 12 in the same manner as the other electrodes in FIG. 1. The surface potential under electrode 32 and the surface potential under the first storage electrode 14 are connected to a comparator means 34. Comparator means 34 is provided and employed only in the embodiment for an analog-to-digital conversion and may be eliminated from the digital-to-analog embodiment. Comparator means 34 is shown symbolically, and in actual practice the surface potentials under electrodes 32 and 14 are compared by removing the charge carriers to two separate regions where they are compared in a manner well known in the art. Since electrode 32 is identical to electrode 14, when the same amplitudes of the surface potential under each electrode there will be a direct comparison of the amounts of charge in the two wells associated with the electrodes.

Figure 3A:
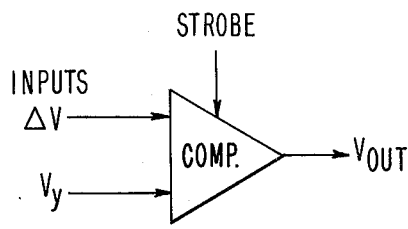
FIGS. 3A and 3B are schematic illustrations of the operation of the comparator means used in the embodiments of FIGS. 1 and 2.
Figure 3B:
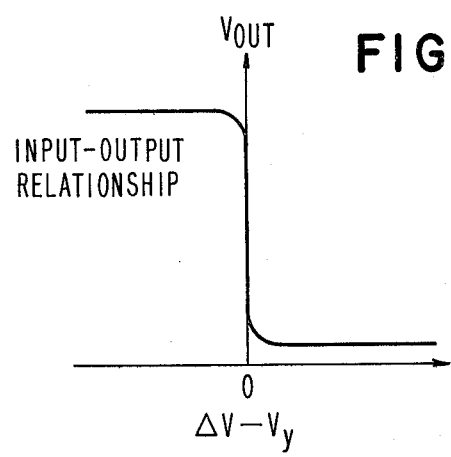

The output of comparator means 34 is connected to a control logic means 36 which is also connected to pulse sources $V_{D1}$, $V_{Tr1}$, $V_a$, $V_{Tr2}$ etc. Comparator means 34 is shown again in FIG. 3A and the associated input-output voltage relationships are illustrated in FIG. 3B. Comparator means 34 may be selected from either of two commercially available types of structures, a d.c. type and a strobe type. In the d.c. type the output voltage continually tracks the comparison between the input voltages $\Delta V$ and $V_y$ where the surface potential under electrode A is designated $V_y$. The strobe type includes a strobe pulse feature that provides an output which represents the comparison of the two input voltages at the time of occurrence of the most recent strobe pulse.

Referring to FIG. 3B, a typical example of the voltage relationship between the output of comparator means 34 and the difference between $\Delta V$ and $V_y$ is illustrated. When $V_y$ is greater than $\Delta V$ the output voltage is at a first relatively high level. At the condition when $\Delta V$ is substantially equal to $V_y$ the output voltage drops, and when $\Delta V$ is greater than $V_y$, the output voltage is at a second relatively low level.

Control logic means 34 responds to either a digital input signal in the digital-to-analog converter embodiment or to the output of comparator means 34 in the analog-to-digital embodiment and generates the pulse sequences which are ultimately used to effect the charge transfer steps in the charge-coupled-device structure. Thus, it should be appreciated that the design of the control logic means 34 differs for the two embodiments and the operation thereof can be more clearly seen in the detailed explanation of two typical conversions which will be provided.

In practice, the present invention is carried out by shifting charge carriers between the potential wells and filling and emptying selected wells, and the following descriptive symbols will be used to explain the different types of operations both in the analog-to-digital and digital-to-analog conversions:

1 → A  The potential well under the A lead (electrode 14) is filled with charge carriers 0 → A  The potential well under the A lead (electrode 14) is emptied of charge carriers 1 → B  The potential well under the B lead (electrode 16) is filled of charge carriers 0 → B  The potential well under the B lead (electrode 16) is emptied of charge carriers 1 → C  The potential well under the C lead (electrode 18) is filled of charge carriers 0 → C  The potential well under the C lead (electrode 18) is emptied of charge carriers A → B  All charge carriers in the potential wells under the A lead are transferred to the potential well under the B lead A ⇌ B  The charge carriers in the potential wells under the A and B leads are redistributed between the two wells so that they are filled to the same level. If they are identical each well ends up with charge carriers $Q = (Q_A + A_B)/2$.

The meanings of the other symbols used in the following explanation such as B → C, B → A, C → B → A, etc., correspond to the given examples.

The digital-to-analog conversion operation wherein comparator 34 is not employed will first be considered. By use of the aforesaid transfer operations, it is possible to generate an analog quantity of charge carriers (or voltage) in a potential well which corresponds to a digital bit pattern and thus provide a digital-to-analog conversion. For example, for a bit pattern of 0101, the operations and the resultant charge in wells A, B and C are set forth below. In the example a 1 in well A, B or C represents a completely filled well, a 0 represents a completely empty well, a ½ represents a half full well, etc. Values in between 1 and 0 also represent signal values, and in the example to follow a digital signal 0101 (magnitude 5) will be converted to a value of 5/16 which represents a value of 5 based on a range of 16 units from 0 and 15.

| OPERATION | WELL A | WELL B | WELL C |
|---|---|---|---|
| Initially | 0 | 0 | 0 |
| 1→A | 1 | 0 | 0 |
| A⇌B | ½ | ½ | 0 |
| 0→A | 0 | ½ | 0 |
| A⇌B | ¼ | ¼ | 0 |
| B⇌C | ¼ | ⅛ | ⅛ |
| 0→C | ¼ | ⅛ | 0 |
| B⇌C | ¼ | 1/16 | 1/16 |
| B→A | 5/16 | 0 | 1/16 |

Figure 4:
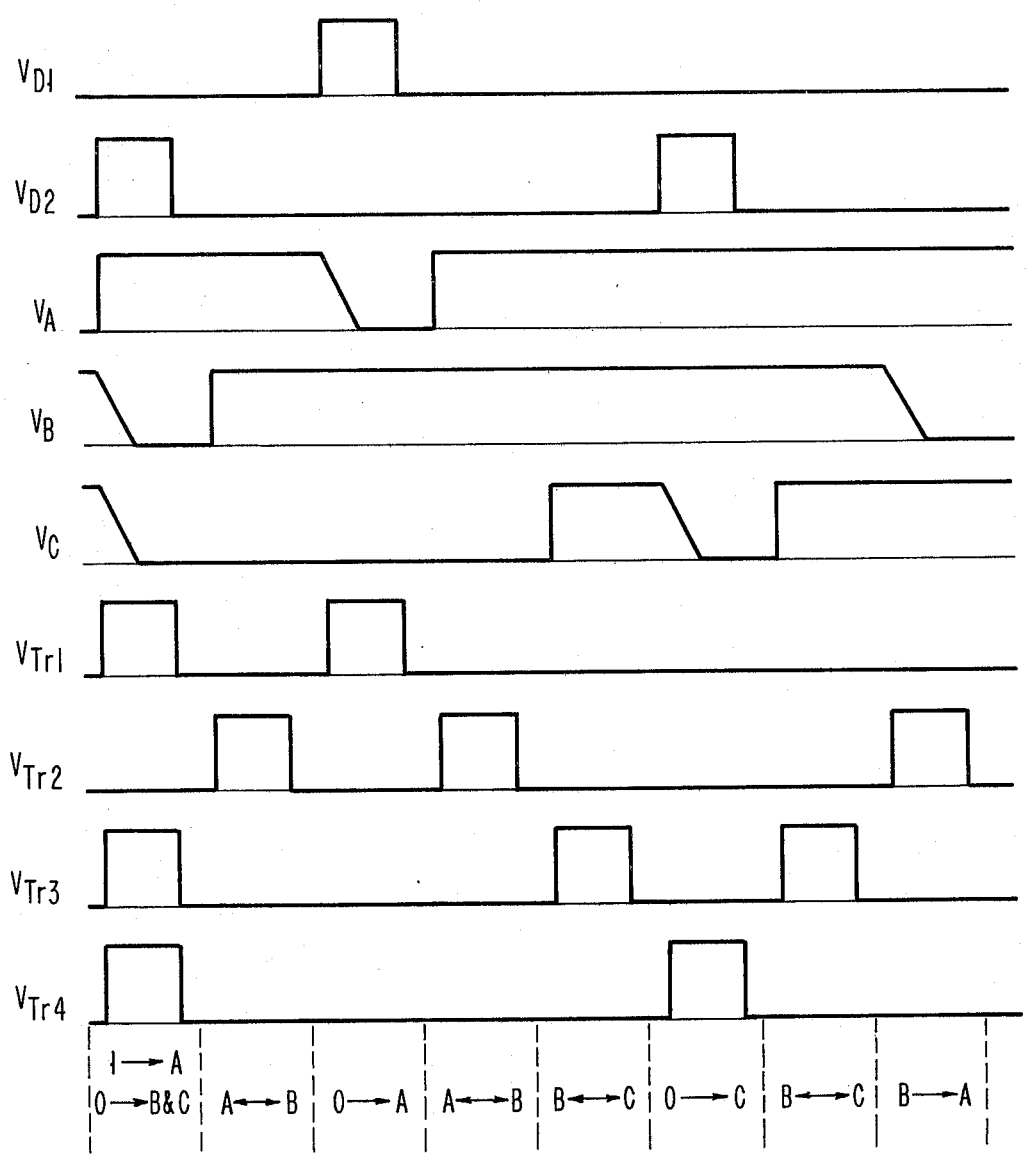
FIG. 4 is an illustration of voltage waveforms useful in explaining the operation of the embodiment of FIGS. 1 and 2.

The previous example can also be more clearly understood by referring to the voltage waveforms illustrated in FIG. 4. In the waveforms, the high voltage levels represent levels which are adequate to form potential wells and the low voltage levels represent levels which are adequate for the removal or elimination of potential wells. FIG. 4 illustrates the voltage levels $V_{D1}$, $V_{D2}$, $V_A$, etc., at the storage electrodes, transfer electrodes etc. for the specified steps of the conversion, as indicated along the bottom of the waveform, that is when charge is entered into the well under electrode A and no charge entered into the wells under electrodes B and C, then when charge is divided between the wells under electrodes A and B etc.

The preceding example should now be able to give one skilled in the art an understanding of the general procedure wherein depending on the bit patterns, the sequence involves adding and/or removing appropriate charge quantities from appropriate wells.

The manner in which the aforesaid conversion is carried out involves first introducing the digital bit pattern into a storage register in control logic means 36. It is assumed for this example that the digital words to be converted are four bits in length and therefore represent any of sixteen values from 0 (0000) to 15 (1111). The digital input word in the storage register of control logic means 36 is read and the proper sequence of signals are transmitted to the pulse sources $V_{D1}$, $V_{TR1}$ etc to generate a sequence of pulses which are applied to the storage electrodes and transfer electrodes to carry out the charge transfer sequence which, in the case of digital word 0101, results in a charge level or potential of 5/16 units in well A which is an analog level value of 5 of a possible 16 total analog units.

One skilled in the art can see that when any of the other possible fifteen digital words (0000, 0001, 0010, 0011, etc.) are applied control logic means 36 can establish a sequence of pulses which, when applied to the storage and transfer electrodes, will produce a series of charge transfer operations that will result in a final charge level or potential in a selected well which will have an analog value $n/16$ where $n$ is an integer corresponding to the value of the digital input signal bit pattern. It is also obvious that the digital-to-analog conversion can be carried out for digital words greater or less than four bits by proper design of control logic means 36 and a corresponding group of charge transfer potential divesting sequences.

For the conversion of analog signal to digital signals comparator 34 is employed. The analog-to-digital conversion is of the successive approximation type and involves developing a series of voltages or charge levels in a manner similar to a binary search, and comparing these voltages to the input analog voltage or charge level. In an embodiment where equal size potential wells are employed for comparing $\Delta V$ and $V_y$, a voltage comparison is the same as a charge comparison. If unequal potential well sizes are used, the comparison is made with a weighting factor.

An example of an analog-to-digital conversion using the structure shown in FIGS. 1 and 2 is provided as follows.

Assume an analog charge level $Q_{\Delta V}$ associated with the input voltage $\Delta V$ such that $6/16 > Q_{\Delta V} > 5/16$ associated with level $Q_y$ associated with the surface voltage $V_y$ under electrode A.

| OPERATION | WELL A | WELL B | WELL C |
|---|---|---|---|
| Initially | 0 | 0 | 0 |
| 1→A, | 1 | 0 | 0 |
| A⇌B | ½ | ½ | 0 |

At this point the comparator 34 indicates that $Q_y > Q_{\Delta V}$ and therefore the most significant bit is "0"

| 0→A | 0 | ½ | 0 |
|---|---|---|---|
| A⇌B | ¼ | ¼ | 0 |

At this point comparator 34 indicates that $Q_y < Q_{\Delta V}$ and therefore the next most significant bit is "1"

| B⇌C | ¼ | ⅛ | ⅛ |
|---|---|---|---|
| B→A | ⅜ | 0 | ⅛ |

At this point the comparator 34 indicates that $Q_y > Q_{\Delta V}$ and the next most significant bit is "0"

| C→B→A | ½ | 0 | 0 |
|---|---|---|---|
| A⇌B | ¼ | ¼ | 0 |
| B⇌C | ¼ | ⅛ | ⅛ |
| 0→C | ¼ | ⅛ | 0 |
| B⇌C | ¼ | 1/16 | 1/16 |
| B→A | 5/16 | 0 | 1/16 |

At this point comparator 34 indicates that $Q_y < Q_{\Delta V}$ and the next significant bit is "1"

The resultant digital signal produced is 0101 which represents the analog value of $Q_{\Delta V}$ between 5/16 and 6/16. If desired, the foregoing sequences can be continued in a straight-forward manner for further accuracy.

As each bit is determined, the number of steps necessary to determine the subsequent bits is dependent on whether the bit obtained was a "1" or a "0." For example, in the preceding discussion the second bit was a "1" and two steps were required to determine the third. The third bit was a "0" and it can be seen that six steps were required to determine the next bit. More specifically, the number of steps required for the conversion depends on the value of $Q_{\Delta V}$: for instance if $8/16 > Q_{\Delta V} > 7/16$ then the aforesaid six steps would be the same but at the step.

| B→A | ⅜ | 0 | ⅛ |
|---|---|---|---|

The comparator would indicate $Q_y < Q_{\Delta V}$ and the next significant bit would be "1" instead of "0."

| B⇌C | ⅜ | 1/16 | 1/16 |
|---|---|---|---|
| B→A | 7/16 | 0 | 1/16 |

The comparator would indicate $Q_y < Q_{\Delta V}$ and the next significant bit would be "1."

The resultant digital word would be 0111 representing an analog value of $Q_{\Delta V}$ between 7/16 and 8/16.

What has been described is an improved analog-to-digital or digital-to-analog converter employing charge-transfer-device technology for carrying out sequences of charge dividing operations. The converter of the present invention is both accurate and efficient because the charge dividing operations are carried out by means of potential wells under the control of bias and transfer signals.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A circuit for converting analog signals or digital signals to digital or analog respectively comprising:
    a charge transfer device including a plurality of charge storage means for storing predetermined discrete quantities of electrical charge carriers and means for selectively sharing the predetermined quantities of charge carriers in any one of said plurality of charge storage means with any adjacent one of said charge storage means by transferring selected amounts of said quantities of electrical charge carriers to be shared out of any one of said charge storage means and into any adjacent one of said charge storage means,
    a control means connected to said charge transfer device for providing a sequence of control signal pulses to effect said selective sharing by transferring said quantities of electrical charge carriers, from out of any one of said charge storage means and into any adjacent one of said charge storage means,
    said charge transfer device and said control means being responsive to an input analog signal or digital signal for producing a sequence of charge carrier transfers back and forth between adjacent charge storage means thereby resulting in a quantity of stored charge carriers manifesting said input signal in digital or analog respectively.

2. A signal converting circuit according to claim 1 wherein said digital signal is applied to said control means to generate said sequence of control signal pulses which are coupled to said charge transfer device to effect said selective sharing by transferring said quantities of electrical charge carriers from out of any one of said charge storage means and into any adjacent one of said charge storage means.

3. A signal converting circuit according to claim 2 wherein said charge transfer device is a charge-coupled-device structure including
a semiconductor substrate,
a plurality of charge storage electrodes connected to said control means for forming potential wells in said semiconductor substrate for storing said predetermined quantities of charge carriers,
and a plurality of charge transfer electrodes connected to said control means for selectively transferring said selected amounts of said quantities of charge carriers out of any one of said potential wells and into any adjacent one of said charge storage means to effect said charge sharing.

4. A signal converting circuit according to claim 3 wherein said charge transfer means functions to transfer one-half the amount of charge carriers in one potential well into another adjacent potential well.

5. A signal converting circuit according to claim 4 wherein said charge-coupled-device structure includes
a semiconductor substrate having first and second spaced-apart diffusion regions in the surface thereof,
an insulating layer disposed over the remainder of said semi-conductor substrate surface,
a plurality of storage electrodes disposed on said insulating layer between said first and second diffusion regions, and
a pluraltiy of transfer electrodes, separate ones of said transfer electrodes being interposed between said diffusion regions and said storage electrodes and between each of said storage electrodes
and wherein said control means includes a control logic circuit means and a plurality of pulse source means, a separate one of said pulse source means being connected between said control logic circuit means and each of said storage and transfer electrodes for producing said control signal pulses for selectively transferring said one-half the amount of charge carriers on any one potential well into any other adjacent potential well.

6. A signal converting circuit according to claim 1 wherein said signal of one form of data representation is an analog signal, said another form of data representation is a digital representation,
said circuit further including a comparison means connected to said charge transfer device and said control means,
and wherein said analog signal is applied to said comparison means for comparing said analog signal with a quantity of stored electrical charge carriers for producing an output signal to said control means to generate said sequence of control signal pulses which are coupled to said charge transfer device to effect said selective transfer of said quantities of electrical charge carriers into and out of said charge storage means.

7. A signal converting circuit according to claim 6 wherein said charge transfer device is a charge-coupled-device structure including a semiconductor substrate, a plurality of charge storage electrodes for forming potential wells in said semiconductor substrate for storing said predetermined quantities of charge carriers, and a plurality of charge transfer electrodes connected to said control means for producing said selectively sharing of said charge carriers by transferring selected amounts of said quantities of charge carriers out of any one of said potential wells and into any adjacent one of said potential wells.

8. A signal converting circuit according to claim 7 wherein said charge transfer means functions to transfer one-half the amount of charge carriers in one potential well into another adjacent potential well.

9. A signal converting circuit according to claim 8 wherein said charge-coupled-device structure includes
a semiconductor substrate having first and second spaced-apart diffusion regions in the surface thereof,
an insulating layer disposed over the remainder of the semiconductor substrate surface,
a plurality of storage electrodes disposed on said insulating layer between said first and second diffusion regions,
a plurality of transfer electrodes, separate ones of said transfer electrodes being interposed between said diffusion regions and said storage electrodes and between each of said storage electrodes
and an input storage electrode disposed on said insulating layer for providing an input storage region for an analog input signal,
said signal converting circuit further including a comparison means connected to said input storage region and one of said potential wells for comparing the stored charge carriers therein for providing an output signal coupled to said control means to generate said sequence of control signal pulses which are coupled to said charge transfer device to effect said selective sharing by transferring said quantities of electrical charge carriers from out of any one of said potential wells, and into any adjacent one of said potential wells.

* * * * *